United States Patent [19]

Tsumura

[11] Patent Number: 5,023,697

[45] Date of Patent: Jun. 11, 1991

[54] SEMICONDUCTOR DEVICE WITH COPPER WIRE BALL BONDING

[75] Inventor: Kiyoaki Tsumura, Itami, Japan

[73] Assignee: Mitsubishi Denki Kabushiki Kaisha, Japan

[21] Appl. No.: 505,482

[22] Filed: Apr. 6, 1990

[30] Foreign Application Priority Data

Jan. 10, 1990 [JP] Japan .................................. 2-1467

[51] Int. Cl.$^5$ ...................... H01L 23/48; H01L 29/44; H01L 39/02; H01L 23/01
[52] U.S. Cl. ......................................... 357/65; 357/69; 357/80; 357/74
[58] Field of Search ....................... 357/65, 80, 74, 69, 357/66, 67, 68, 71; 420/469

[56] References Cited

U.S. PATENT DOCUMENTS 4,676,827  6/1987  Hosada et al. ...................... 420/469
4,872,047  10/1989  Fister et al. ........................ 357/74 X

FOREIGN PATENT DOCUMENTS 0078480  11/1982  European Pat. Off. .
1457806  12/1976  United Kingdom .

OTHER PUBLICATIONS

Tsumura et al., "Fundamental Study of . . . Its Reliability", IMC 1988 Proceedings, Tokyo, 1988, pp. 388-392.
Onuki et al., "Investigation . . . Aluminum Electrodes", 1987 IEEE, vol. CHMT-12, No. 4, Dec. 1987, pp. 550-555.
Sakamoto et al., "Development of Copper Wire . . . Production", pp. 31-36.

Primary Examiner—William Mintel
Assistant Examiner—R. Potter
Attorney, Agent, or Firm—Leydig, Voit & Mayer

[57] ABSTRACT

A semiconductor device in accordance with the present invention includes a semiconductor chip which is bonded to a die pad using a solder having a liquidus temperature of 370° C. or less. A copper ball is moved to contact an Al electrode pad on the semiconductor chip in less than 150 ms after formation of the ball. Plastic deformation takes place so that the copper ball is pressed against the aluminum electrode pad and the height of the copper ball becomes 25 μm or less. It is possible to firmly wire the Al pad on the semiconductor chip and the inner lead frame without cracking the glass coating by utilizing a silver plating on the die pad and an Au-metallized layer on the rear side of the semiconductor chip. It is also possible to decrease the work hardening property of the Cu ball and prevent Al exudation when the Cu ball is bonded to the Al electrode pad.

9 Claims, 7 Drawing Sheets

TIME FROM Cu-BALL FORMATION
TO THE CONTACT WITH Aℓ PAD (t) [ms]

SEMICONDUCTOR DEVICE WITH COPPER WIRE BALL BONDING

BACKGROUND OF THE INVENTION

1. Field of the Invention

The present invention relates to a semiconductor device in which a fine copper wire (Cu wire) is used and a die bonding material is used for bonding a semiconductor chip on a die pad. The present invention also relates to a method of manufacturing a semiconductor device with which a copper (Cu) ball is brought into contact with an aluminum (Al) electrode pad for a predetermined time and the Cu ball is compressed.

2. Description of the Related Art

FIG. 1 is a cross-sectional side view of a conventional semiconductor device. In the drawing, a semiconductor chip 1 is bonded onto a die pad 3 of a lead frame with an epoxy resin 4. An Al electrode pad 5 is provided on the surface of the semiconductor chip 1, the surface of the portion without the Al electrode pad 5 being covered with an $SiO_2$ glass coating 6 for preventing corrosion of the Al wiring by impurities in the molding resin of the chip 1. The Al electrode 5 and an inner end of lead 7 are electrically connected to each other with a Cu wire 8. Silver is plated on the surface of the inner lead 7 and the die pad 3. Both are formed of a copper alloy or an iron nickel alloy.

FIG. 2 is a cross-sectional side view of another conventional semiconductor device which is the same as that shown in FIG. 1 except that gold-silicon (Au-Si) solder 10 is used as a die bonding material.

In the conventional semiconductor devices described above, it is generally necessary to select a suitable die bonding material. An unsuitable material causes degradation of the semiconductor chip during heating in the die bonding process and junction faults during the wire bonding process.

When the die bonding material is an epoxy resin 4 (FIG. 1), the epoxy resin 4 is cured at a temperature of 150° C. to 250° C. which does not degrade the semiconductor chip 1. However, some problems occur in the wire bonding process.

FIGS. 3A and 3B are respectively a plan view and a cross-sectional view of the Al electrode pad 5 of the semiconductor chip 1 bonded on the die pad 3 with the epoxy resin 4 after the Al electrode pad 5 has been removed by etching with nitric acid ($HNO_3$) following bonding of a Cu ball to the Al electrode pad 5. In these drawings, the Al leaves an exuded Al portion 11. A $SiO_2$ film 13, which is under Al film 12, is thus exposed. As a result, the high temperature storage life deteriorates, as described in Japanese Published Patent Application 1-143332. If ultrasonic energy which causes the exudation of Al is decreased, no Cu-Al alloy layer is created so that high temperature storage life deteriorates.

The reasons for these effects are the estimated wire bonding temperature is 250° C. to 300° C. while the glass transition temperature Tg of the epoxy resin is 110° C. to 150° C. The Cu ball is plastically deformed on the Al electrode pad 5 by applying a greater ultrasonic vibration energy than in the case of an Au ball. Therefore, more work hardening occurs with the Cu ball than with an Au ball.

When the die bonding material is the Au-Si solder 10 (FIG. 2), the die bonding temperature is higher than 370° C. which is the liquidus temperature of the Au-Si solder. This causes cracks in the glass coating 6 and degrades the semiconductor chip 1.

FIG. 4A is a perspective view of the semiconductor chip 1 and the die pad 3, and FIG. 4B is a cross-sectional side view taken along line A—A of FIG. 4A. FIG. 5 is a plan view of the semiconductor chip 1 on which the structural analysis is carried out. In the drawings, Al wiring 14 is entirely covered with the glass coating 6. In the structural analysis, after die bonding, cracks were found in the glass coating 6 of the semiconductor chip 1 bonded on the die pad 3 with the Au-Si solder 10. In the analysis, the chip was immersed in a solution of 80° C. to 90° C. phosphoric acid ($H_3PO_4$) for 20 minutes, and the Al wiring 14 under the glass coating 6 was etched. A resin molded chip deteriorated in pressure cooker tests after the resin deteriorated. The reason for the cracking is believed to be the concentration of stress in a certain portion of the glass coating 6 over the Al wiring 14 because the coefficients of thermal expansion of the glass coating 6 and the semiconductor chip 1 are different ($SiO_2$ of the glass coating: $0.65 \times 10^6/°$ C., Si of the semiconductor chip: $3.5 \times 10^6/°$ C.). When the die bonding material is Au-Si solder 10, the wire bonding temperature must be raised to a higher temperature than that of an Au wire to encourage mutual diffusion between the Cu wire and the Al electrode.

In the above-described semiconductor device, when the die bonding material is an epoxy resin, the semiconductor chip is not bonded well because the temperature during wire bonding is higher than that of the glass transition temperature of the epoxy resin. In addition, the Cu ball is plastically deformed on the Al electrode pad because more ultrasonic vibration energy is applied to a Cu ball than for an Au ball because work hardening of the Cu ball is higher than that of the Au ball. This hardening pushes Al out of the Al electrode pad the $SiO_2$ under film is thus exposed, and the semiconductor device deteriorates in a high temperature storage test.

When Au-Si solder is used for the purpose of establishing a wire bonding temperature higher than that used with an Au wire, the glass coating of the semiconductor chip cracks at the die bonding temperature, and a resin bonded chip deteriorates in the pressure cooker test.

SUMMARY OF THE INVENTION

The present invention has been achieved in order to solve the above-described problems It is an object of the present invention to provide a semiconductor device using a Cu wire and a die bonding material to firmly bond the semiconductor chip on a die pad at a lower temperature to avoid cracks in a glass coating.

It is another object of the present invention to provide a method of producing a semiconductor device which heats one end of a Cu wire to form a ball, holds heat in the Cu ball, prevents an oxide film from growing on the Cu ball surface, increasing the hardness itself, and applies ultrasonic vibrations during bonding, causing both the Cu and Al atoms to vibrate efficiently without Al exudation.

In order to achieve these objects, the present invention provides a semiconductor device comprising a die pad, a semiconductor chip disposed on the die pad and having an aluminum electrode pad and a glass coating, a solder bonding the semiconductor chip to the die pad and having a liquidus temperature at which cracks due to the difference in thermal expansion between the glass coating and the semiconductor chip do not appear, and a fine copper wire bonded to the aluminum electrode pad.

The present invention also provides a method of producing a semiconductor device comprising forming a copper ball by melting one end of a fine copper wire, moving the copper ball and bringing it into contact with the aluminum electrode pad on a semiconductor chip within less than 150 ms after the formation of the copper ball, and then pressing the copper ball on the aluminum electrode pad so that the height of the copper ball is 25 μm or less.

DETAILED DESCRIPTION OF PREFERRED EMBODIMENT

The present invention is different from the prior art in that, in spite of the change of the wire material from Au to Cu, the problem to be solved was not clearly analyzed in the prior art. The prior art failed to improve device reliability and was not a mass-production technique. In the present invention, a solder-type die bonding material is selected in order to effectively apply ultrasonic vibrations to a Cu ball and an Al electrode pad to improve the plastic deformation of the Cu ball which has a larger work hardening property than an Au ball.

The die bonding material, such as Pb-5% Sn solder or the like, is selected to have a liquidus temperature of 370° C. or less to prevent glass coating cracking at the heating temperature of the semiconductor chip.

The time from formation of the Cu ball to contact with the Al electrode pad is 150 ms or less. The longer the time taken, the more an oxide film on the Cu ball surface grows, adversely affecting the plastic deformation property of the Cu ball and reducing the heat energy in the Cu ball itself. Further, the height of the Cu ball after pressing is kept as small as possible, i.e., 25 μm or less.

Figure 1:
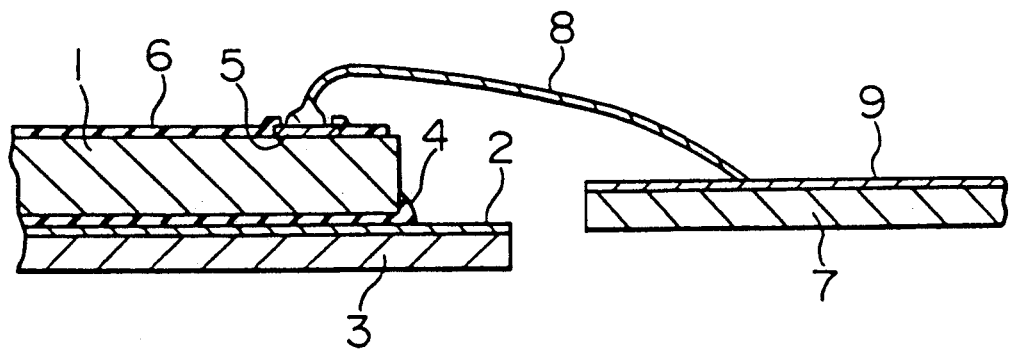
FIGS. 1 and 2 are cross-sectional side views of conventional semiconductor devices.
Figure 2:
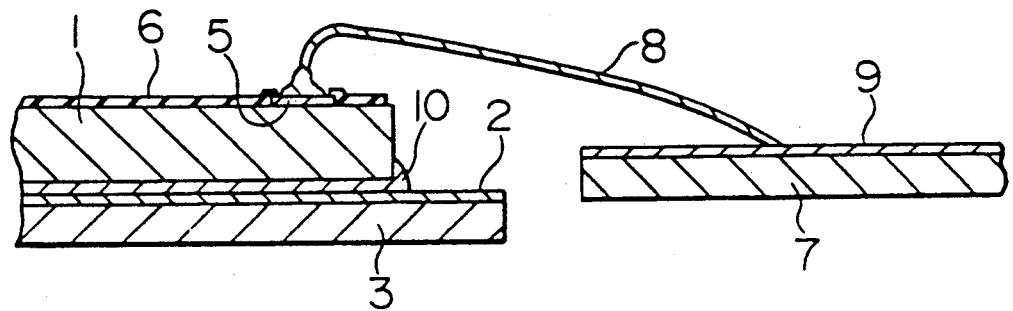
Figure 3A:
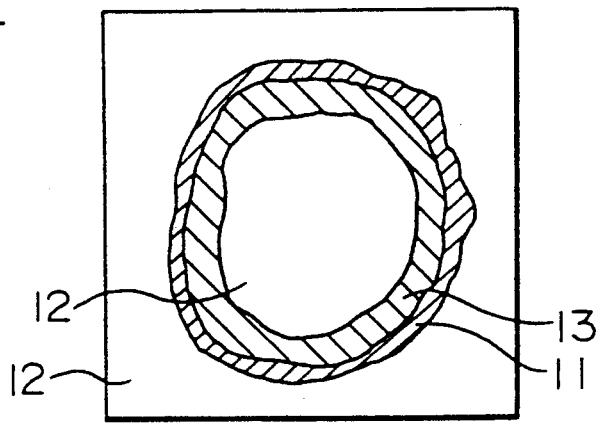
FIGS. 3A and 3B are respectively a plan view and a cross-sectional side view of the Al electrode pad of a conventional semiconductor device on which a structural analysis has been carried out.
Figure 3B:
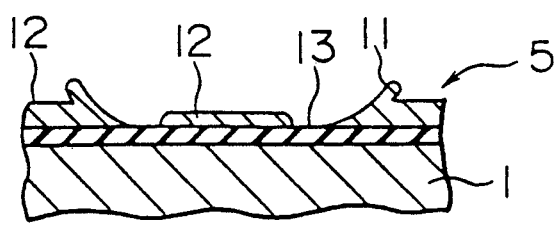
Figure 4A:
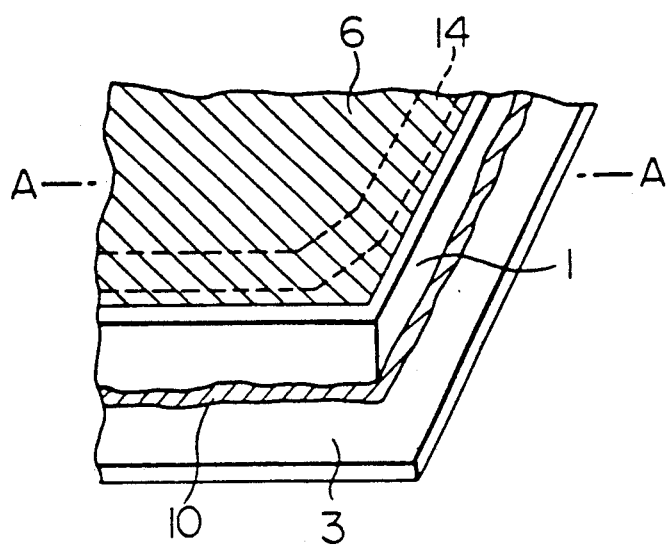
FIGS. 4A and 4B are respectively a perspective view and a cross-sectional side view of a conventional semiconductor device after die bonding.
Figure 4B:
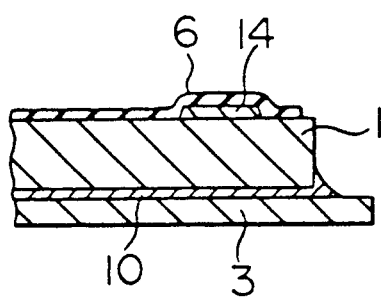
Figure 5:
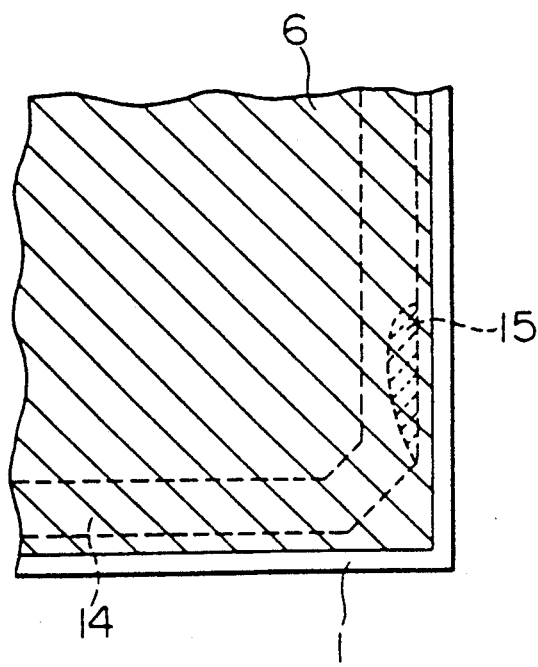
FIG. 5 is a plan view of a semiconductor chip on which a structural analysis of a glass coating crack occurring when a semiconductor chip is die bonded has been carried out.
Figure 6:
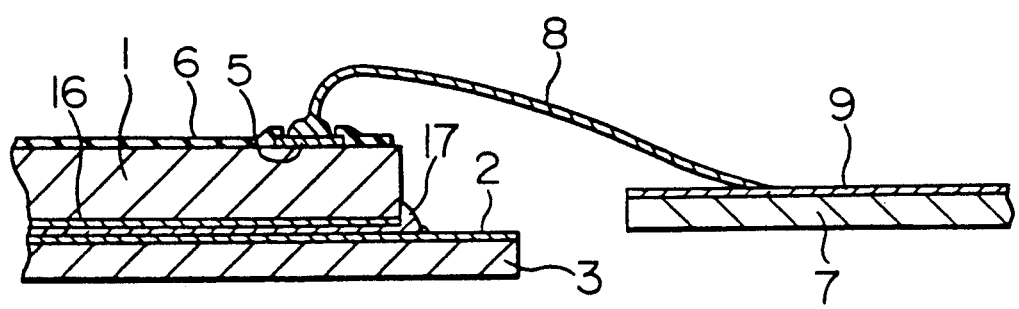
FIG. 6 is a cross-sectional side view of a semiconductor device according to one embodiment of the present invention.

FIG. 6 is a cross-sectional side view of an embodiment of the present invention in which reference numerals 1 to 3 and 5 to 9 denote the same elements as in the conventional semiconductor device. A Ti-Ni-Au layer is provided as an Au metallized layer 16 on the rear side of the semiconductor chip 1, and Pb-5% solder 17 is placed between the metallized layer 16 and the silver plating 2 on the die pad 3 in order to bond the semiconductor chip 1 on the die pad 3.

Figure 7:
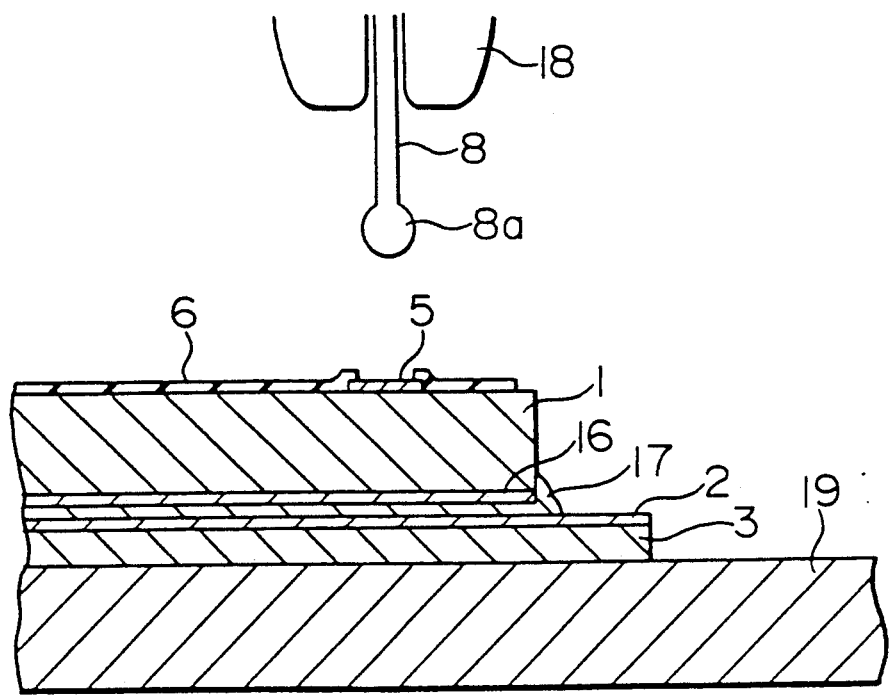
FIG. 7 is a schematic view of the arrangement in a wire bonding step after forming a Cu ball.

FIG. 7 is a schematic view of a wire bonding step after forming a Cu ball. In the drawing, a capillary tip 18 is disposed above the semiconductor chip 1 for pressing the Cu ball 8a on the Al electrode pad 5, and a heat block 19 for heating the die pad 3 is placed under the die pad 3.

Figure 8:
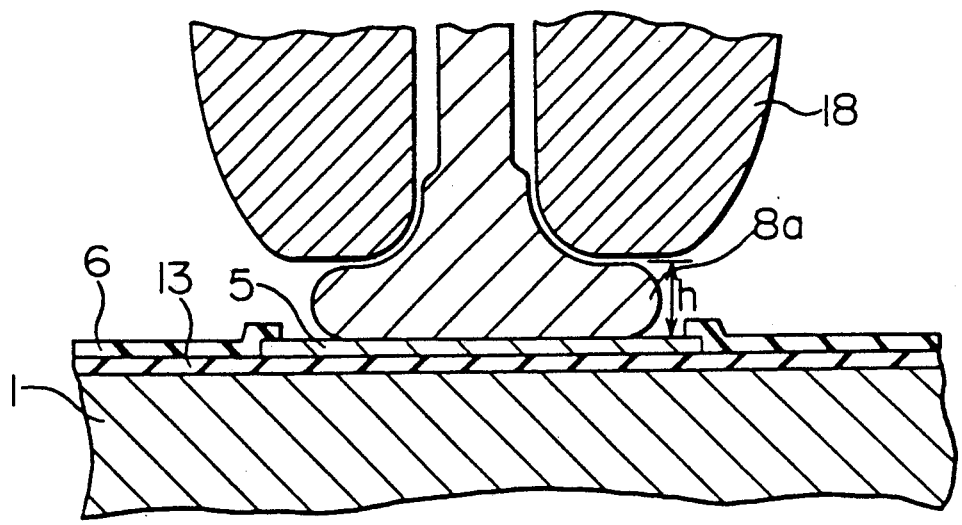
FIGS. 8 and 10 are cross-sectional side views which show a Cu ball being bonded to an Al electrode pad.

In the above-mentioned semiconductor device, the Cu ball 8a is moved together with the capillary tip 18 onto the Al electrode pad 5, as shown in FIG. 8, a force of about 150 g is applied to the Al electrode pad 5, ultrasonic vibration energy is supplied through the capillary tip 18 and heat energy (raising the temperature to about 280° C.) is supplied from the heat block 19.

In order to understand the quantitative value of the Cu ball 8a plastic deformation, the Cu ball 8a was bonded to the Al electrode pad 5 by applying the same amount of ultrasonic vibration energy through the capillary tip 18 and the height h of the Cu ball 8a (squashed) was measured as a function of the time t from the Cu ball 8a formation to contact with the Al electrode pad 5.

Figure 9:
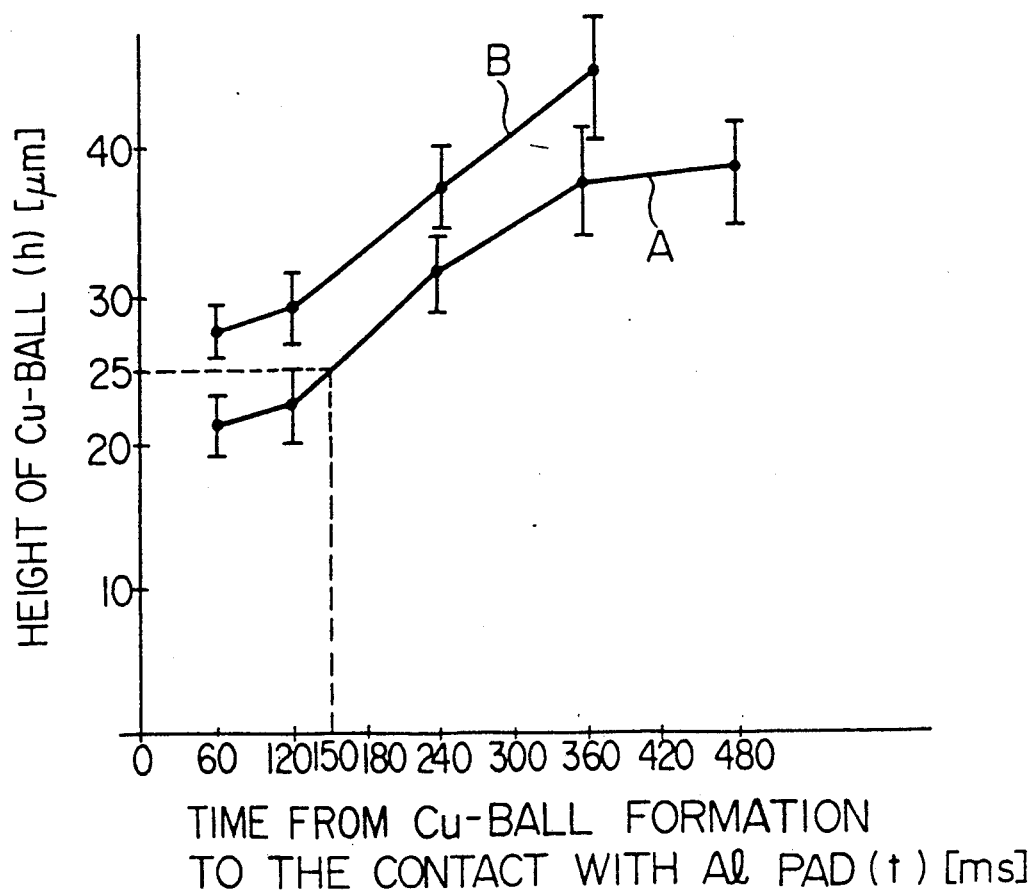
FIG. 9 is a graph of the relationship between the height of a Cu ball and the time from Cu ball deformation to contact with an Al electrode pad.

The results of the measurements are shown in FIG. 9. It is found from FIG. 9 that for a time t of less than 150 ms the height of the Cu ball 8a is almost constant, while for a time longer than 150 ms the height of the Cu ball 8a is not constant and varies widely. It is, therefore, found that the plastic deformation of the Cu ball 8a is stable as the time t decreases and that, judging from the mechanical limit of the production equipment used, a time of less than 150 ms is the best condition. In addition, a time t of less than 120 ms is preferable, and a time from 150 ms to 100 ms exhibits excellent results.

Figure 10:
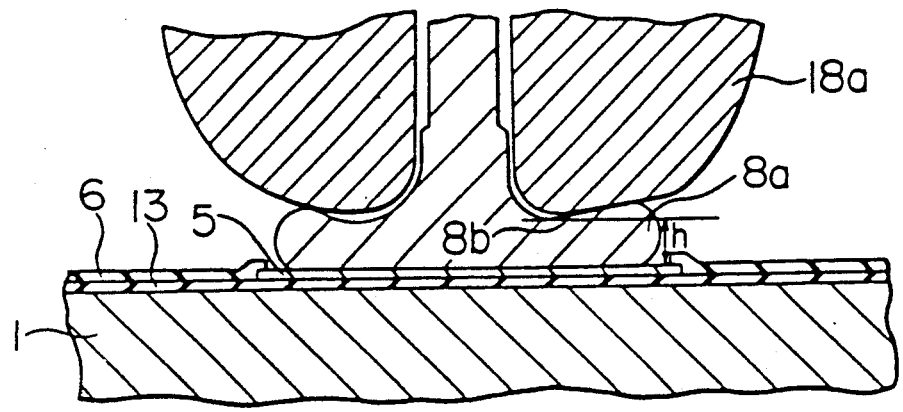
Figure 11:
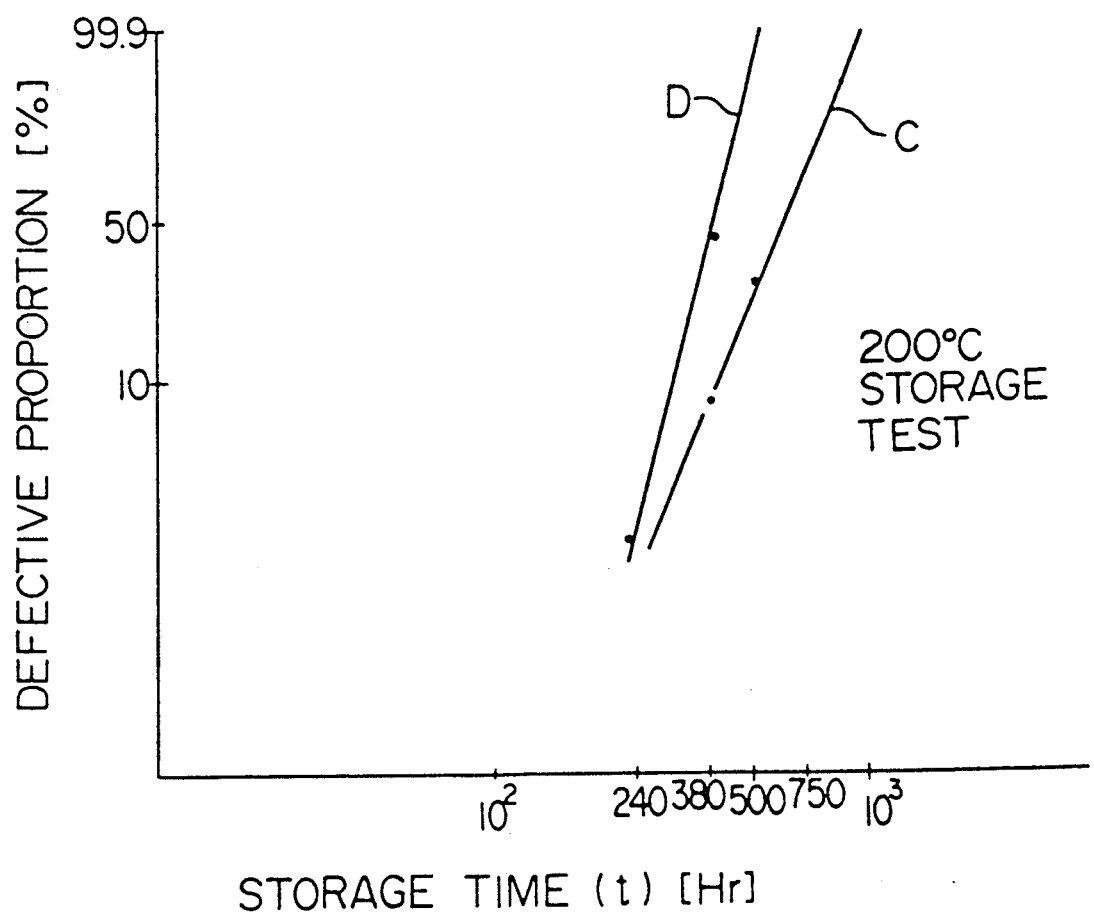
FIG. 11 is a Weibull plot which shows high temperature storage life test results for a semiconductor device according to the present invention and a conventional semiconductor device.
Figure 12:
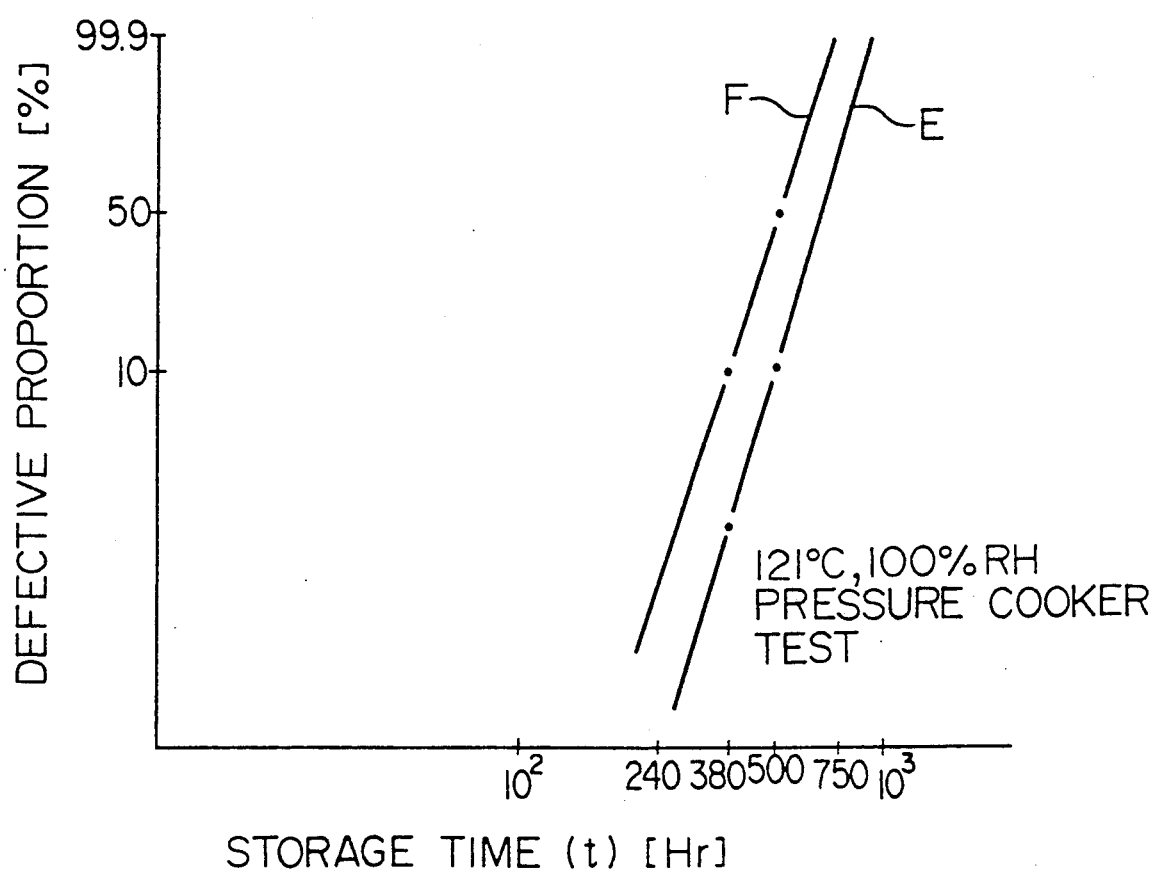
FIG. 12 is a Weibull plot which shows the pressure cooker test results for a semiconductor device according to the present invention and a conventional semiconductor device.
Figure 13A:
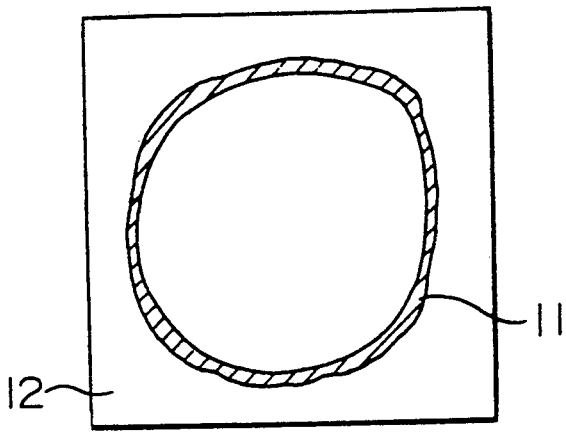
FIGS. 13A and 13B are respectively a plan view and a cross-sectional side view of an Al electrode pad after etching and removing a bonded Cu ball with nitric acid.
Figure 13B:
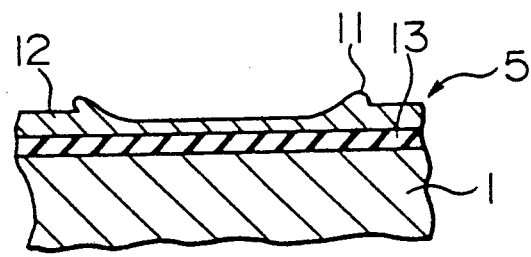
Figure 14:
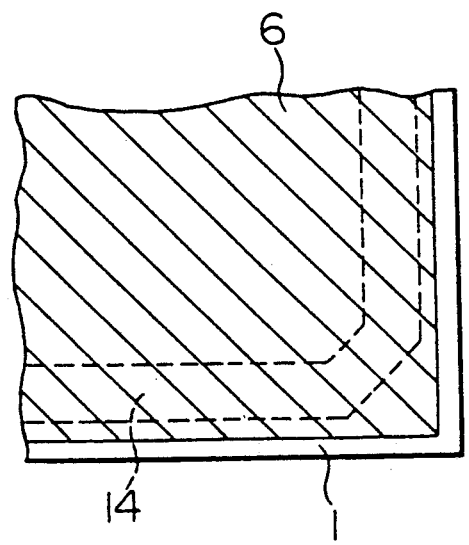
FIG. 14 is a plan view of a semiconductor chip on which a structural analysis of a glass coating crack produced when the chip is die bonded has been carried out.

If the height of the squashed Cu ball 8a is 25 μm or less, a Cu-Al alloy can be produced safely without damaging the semiconductor chip 1 while, if the height exceeds 25 μm, an alloy cannot be adequately produced without damaging the semiconductor chip 1 which may reduce device reliability. With the capillary tip 18a shown in FIG. 10, the height h of the Cu ball 8a (squashed) is defined as the shortest distance between the recess 8b (see FIG. 10) of the Cu ball 8a and the Al electrode pad 5. In FIG. 9, curve A shows the results obtained when the Cu ball 8a had a small diameter and curve B shows the results obtained when the Cu ball 8a had a large diameter. Generally, the diameter of the Cu wire 8 is about 25 μm, and the diameter of the Cu ball 8a (squashed) is 100 μm or less.

Although the above-described embodiment employs the Pb-5% Sn solder as a soldering material, any other solder having a liquidus temperature of 370° C. or less can be used in the same manner as that described above. For example, solder composed of Pb-Sn (5% or more of Sn), Pb-Ag, Pb-In, Sn-Ag, Pb-Ag-Sn, Pb-Ag-In, and the like can be used. In addition, although the Ti-Ni-Au layer is used as the metallized layer 16, the surface of the layer may be metallized by Au or Ag, for example, an Ag-metallized layer, such as Cr-Ag or the like, may be used as the metallized layer.

Further, this invention may be used with non-planar ICs without a glass coating and any insulating film, such as an $SiO_2$ film. A semiconductor device made of a compound, such as GaAs or the like, other than Si may be used as a substrate. The under layer of the Al film of the Al electrode pad 5 is not limited to the $SiO_2$ film.

As described above, the present invention prevents the glass coating from cracking and bonds the semiconductor chip to the die pad with solder situated between the silver plating on the die pad and the Au-metallized layer formed on the rear side of the semiconductor chip. The present invention also decreases the work hardening property of the Cu ball and thus prevents Al from being exuded when the Cu ball is bonded on the Al electrode pad. It is also possible to avoid Al exudation by applying ultrasonic vibrations to both the Cu ball and the Al electrode pad. However, the greatest advantage of the present invention is that the same bonding process employed with an Au wire can be performed with a Cu wire without major changes to realize practical reliability for the semiconductor device.

What is claimed is:

1. A semiconductor device comprising:
   a die pad;
   a silicon semiconductor chip having opposed first and second surfaces bonded at the second surface to said die pad;
   an aluminum electrode pad, an aluminum wire, and a glass coating disposed on the first surface of said chip;
   a solder bonding said semiconductor chip at the second surface to said die pad having a liquidus temperature at which no cracking occurs between said glass coating and said semiconductor chip; and
   a fine copper wire ball bonded to said aluminum electrode pad.

2. A device according to claim 1, wherein said liquidus temperature is 370° C. or less.

3. A device according to claim 1, wherein said solder is composed of Fb-5% Sn.

4. A device according to claim 1, wherein said solder is selected from the groups consisting of Pb-Ag, Pb-In, Sn-Ag, Pb-Ag-Sn, and Pb-Ag-In.

5. A device according to claim 1 further comprising a metallized layer formed between said solder and said semiconductor chip.

6. A device according to claim 5, wherein said metallized layer is a gold-metallized layer.

7. A device according to claim 6, wherein said gold-metallized layer is composed of Ti-Ni-Au.

8. A device according to claim 5, wherein said metallized layer is a silver-metallized layer.

9. A device according to claim 8, wherein said silver-metallized layer is composed of Cr-Ag.

* * * * *

UNITED STATES PATENT AND TRADEMARK OFFICE
CERTIFICATE OF CORRECTION

PATENT NO. : 5,023,697

DATED : June 11, 1991

INVENTOR(S) : Kiyoaki Tsumura

It is certified that error appears in the above-identified patent and that said Letters Patent is hereby corrected as shown below:

Column 6, Claim 4, line 20, change "Pb-Ag4" to --Pb-Ag,--.

Signed and Sealed this

Twenty-third Day of February, 1993

Attest:

STEPHEN G. KUNIN

*Attesting Officer*   *Acting Commissioner of Patents and Trademarks*